US008920939B2

(12) United States Patent
Williams et al.

(10) Patent No.: US 8,920,939 B2
(45) Date of Patent: Dec. 30, 2014

(54) HETEROATOMIC REGIOREGULAR POLY (3-SUBSTITUTEDTHIOPHENES) IN ELECTROLUMINESCENT DEVICES

(75) Inventors: Shawn P. Williams, Pittsburgh, PA (US); Darin W. Laird, Pittsburgh, PA (US); Troy D. Hammond, Pittsburgh, PA (US)

(73) Assignee: Solvay USA, Inc., Cranbury, NJ (US)

( * ) Notice: Subject to any disclaimer, the term of this patent is extended or adjusted under 35 U.S.C. 154(b) by 991 days.

(21) Appl. No.: 11/234,374

(22) Filed: Sep. 26, 2005

(65) Prior Publication Data

US 2006/0078761 A1 Apr. 13, 2006

Related U.S. Application Data

(60) Provisional application No. 60/612,640, filed on Sep. 24, 2004.

(51) Int. Cl.

| | |
|---|---|
| ***H01L 51/54*** | (2006.01) |
| ***H01B 1/12*** | (2006.01) |
| ***H01L 51/00*** | (2006.01) |
| *H01L 51/50* | (2006.01) |

(52) U.S. Cl.

CPC ............ *H01B 1/127* (2013.01); *H01L 51/5088* (2013.01); *H01L 51/0036* (2013.01); *H01L 51/5048* (2013.01); *H01L 51/5052* (2013.01); *Y10S 428/917* (2013.01)

USPC ........... 428/690; 428/917; 313/504; 313/506; 252/301.16; 257/40; 257/103; 257/E51.029

(58) Field of Classification Search

CPC ............ H01L 51/5048; H01L 51/5052; H01L 51/5056; H01L 51/506; H01L 51/5088; H01L 51/0037; C08G 61/126

USPC ....... 252/301.35, 500, 518; 257/40, E51.044; 428/690, 917; 313/504, 506; 525/417, 525/535; 528/73, 377, 378

See application file for complete search history.

(56) References Cited

U.S. PATENT DOCUMENTS

| | | | | |
|---|---|---|---|---|
| 4,711,742 | A | 12/1987 | Jen et al. | |
| 5,093,033 | A * | 3/1992 | Feldhues et al. | 252/500 |
| 6,166,172 | A | 12/2000 | McCullough et al. | |
| 6,203,933 | B1 * | 3/2001 | Nakaya et al. | 428/690 |
| 6,391,481 | B1 * | 5/2002 | Jonas et al. | 428/690 |
| 6,602,974 | B1 | 8/2003 | McCullough et al. | |
| 7,294,288 | B2 | 11/2007 | Koller et al. | |
| 2003/0062536 | A1 | 4/2003 | Heeney et al. | |
| 2003/0218418 | A9 * | 11/2003 | Sato et al. | 313/504 |
| 2004/0030091 | A1 | 2/2004 | McCullough et al. | |
| 2004/0092690 | A1 | 5/2004 | Giles et al. | |
| 2004/0178408 | A1 * | 9/2004 | McCulloch et al. | 257/40 |
| 2004/0186265 | A1 * | 9/2004 | Liu et al. | 528/377 |
| 2004/0241492 | A1 * | 12/2004 | Tokuda et al. | 428/690 |
| 2006/0076050 | A1 | 4/2006 | Williams et al. | |
| 2006/0175582 | A1 | 8/2006 | Hammond et al. | |

FOREIGN PATENT DOCUMENTS

| | | | |
|---|---|---|---|
| DE | 103 49 029 | A1 | 6/2005 |
| EP | 1 279 691 | A1 | 1/2003 |
| WO | WO 99/13692 | A | 3/1999 |
| WO | WO 2005/081335 | | 9/2005 |

OTHER PUBLICATIONS

Jarrett et al. "Field effect measurements in doped conjugated polymer films: Assessment of charge carrier mobilities." J. Appl. Phys. vol. 77, No. 12, 1995.*

McCullough, R. D., "The Chemistry of Conducting Polythiophenes," Adv. Mat., vol. 10, No. 2, pp. 93-116 (1998).

McCullough, R. D., et al., "Regioregular, Head-to-Tail Coupled Poly(3-alkylthiophene) and its Derivatives", Polymers, $2^{nd}$ Ed., Chptr. 9, pp. 225-258 (1998).

Friend, R. H., et al., "Electroluminescence in Conjugated Polymers", $2^{nd}$ Ed., Chptr. 29, pp. 823-846 (1998).

Daoust, G. et al., "Structure-Property Relationships in Alkoxy-Substituted Polythiophenes", Macromolecules, vol. 24, No. 2, p. 455 (1991).

LeClerc, M., et al., "Design of New Conducting 3, 4-Disubstituted Polythiophenes", Journal of the Chemical Society, pp. 273-274 (1990).

LeClerc, M. et al., "Electrical and Optical Properties of Processable Polythiophene Derivatives: Structure-Property Relationships", Adv. Mater., vol. 9, No. 14, pp. 1087-1089 (1997).

The Encyclopedia of Polymer Science and Engineering, Wiley, pp. 298-300 (1990).

PCT/US2005/034042, International Search Report, Jan. 16, 2005 (3 pages).

* cited by examiner

*Primary Examiner* — Michael H Wilson

(74) *Attorney, Agent, or Firm* — The Marbury Law Group, PLLC

(57) ABSTRACT

Regioregular polythiophenes having heteroatoms in the substituents can be used in hole injection layer and hole transport layers for electroluminescent devices. Copolymers and organic oxidants can be used. Homopolymers can be used. Metallic impurities can be removed. The heteroatom can be oxygen and can be substituted at the 3-position. Advantages include versatility, synthetic control, and good thermal stability. Different device designs can be used.

11 Claims, 15 Drawing Sheets

HETEROATOMIC REGIOREGULAR POLY (3-SUBSTITUTEDTHIOPHENES) IN ELECTROLUMINESCENT DEVICES

RELATED APPLICATIONS

This application claims priority to provisional application Ser. No. 60/612,640 filed Sep. 24, 2004, which is hereby incorporated by reference in its entirety including claims and figures.

BACKGROUND

Organic electroluminescent devices can utilize organic small molecules or polymers that produce light when transferred into their excited state by an external power source. The excited state is created when positive and negative charges flow from opposite electrodes into the electroluminescent materials. Frequently, in multi-layer devices, hole injection and/or hole transport materials between one electrode and the electroluminescent material improve the efficiency of the device. These devices are being designed for use in, for example, monochrome and colored flat panel displays, signage, and white lighting. With increasing commercial demands, however, better devices are needed which have better materials suited for particular application and which can be tailored, commercially made, and provide good stability.

WO 2005/081335 (Gambogi et al., DuPont) describes multilayer devices including charge transport layers and processing methods.

EP 1,279,691 (Heeney et al., Merck) describes fluorinated semiconducting materials.

US Patent Publication 2005/0080219 (Koller et al.) purportedly describes methods of making polythiophenes.

U.S. Pat. Nos. 6,602,974 and 6,166,172 to McCullough et al. describe regioregular polythiophenes including homopolymers and block copolymers.

A need exists for better control over the synthesis of new materials for particular device applications including both the doped and undoped states.

SUMMARY

One embodiment provides regioregular poly(3-substituted thiophenes) including their copolymers in which the 3-alkyl or aryl substituent possesses heteroatom substitution for use as hole injection or hole transport layers in organic electroluminescent devices. Advantages include improved stability and synthetic control.

One embodiment provides an electroluminescent device comprising an HIL/HTL layer which comprises at least one polymer comprising a regio-regular poly(3-substitutedthiophene) in which the 3-substituent is an alkyl, aryl, or alkyl/aryl moiety with a heteroatom substitution in either the α- or beta-position of the 3-substituent.

An electroluminescent device comprising an HIL/HTL layer which comprises at least one polymer comprising a regio-regular poly(3-substitutedthiophene) in which the 3-substituent is an alkyl, aryl, or alkyl/aryl moiety with a heteroatom substitution in either the α- or beta-position of the 3-substituent, wherein the 3-substituent is an alkyl group with an oxygen substitution in the alpha position, and the polymer is a homopolymer.

Another embodiment provides an electroluminescent device comprising an HIL/HTL layer which comprises at least one polymer comprising a regio-regular poly(3-substitutedthiophene) in which the 3-substituent is an alkyl, aryl, or alkyl/aryl moiety with a heteroatom substitution in either the α- or beta-position of the 3-substituent, wherein the 3-substituent is an alkyl group with an oxygen substitution in the alpha position, and the polymer is a random copolymer.

Another embodiment provides an electroluminescent device comprising an HIL/HTL layer which comprises at least one polymer comprising a regio-regular poly(3-substitutedthiophene), wherein the 3-substituent is an alkyl group with an oxygen substitution in the alpha position and the polymer is doped with an organic oxidant.

Another embodiment provides an electroluminescent device comprising an HIL/HTL layer which comprises at least one polymer comprising a regio-regular poly(3-substitutedthiophene), wherein the 3-substituent is an alkyl group with an oxygen substitution in the alpha position and the polymer is doped with an organic oxidant sufficiently to provide stability at 110° C. for 10 minutes as shown in UV-Vis-NIR analysis.

Another embodiment provides an electroluminescent device comprising an ELL material and an HIL/HTL material, wherein the HIL/HTL material comprises at least one polymer comprising a regio-regular poly(3-substitutedthiophene) in which the 3-substituent is an alkyl, aryl, or alkyl/aryl moiety with a heteroatom substitution in either the α- or beta-position of the 3-substituent, wherein the HIL/HTL material bonds with the ELL layer.

The present invention also provides methods of making electroluminescent devices and methods of using electroluminescent devices.

Another basic and novel feature is the material has metallic impurities at a level sufficiently low to allow for electroluminescent applications.

In addition, the use of the heteroatom provides tunability to the electroluminescent device.

DETAILED DESCRIPTION

Introduction

Figure 1:
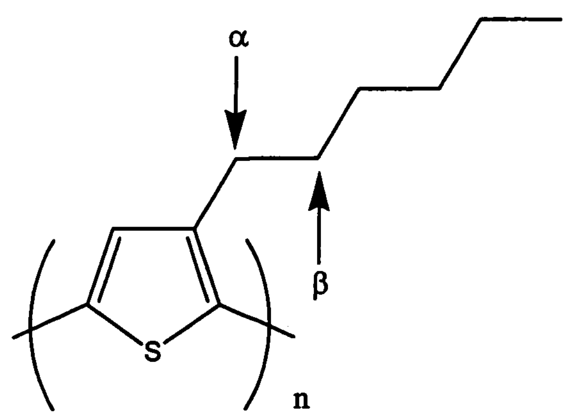
FIG. 1 illustrates regio-regular poly(3-substituted thiophene) with α and β positions of the 3-substituent indicated
Figure 2:
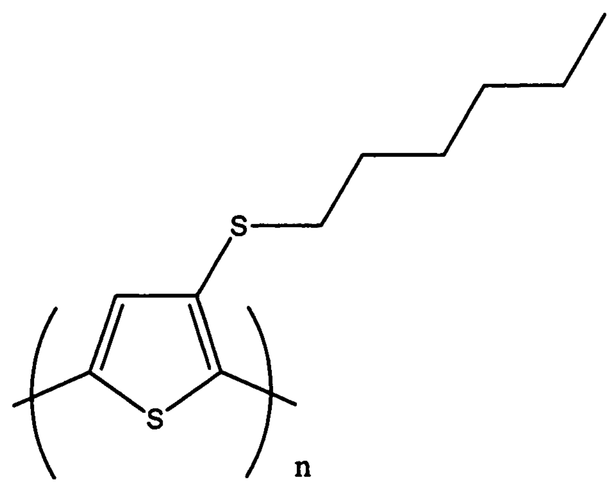
FIG. 2 illustrates poly(3-[α-thiaheptyl]thiophene), poly(3-substituted thiophene) with α hetero substitution.
Figure 3:
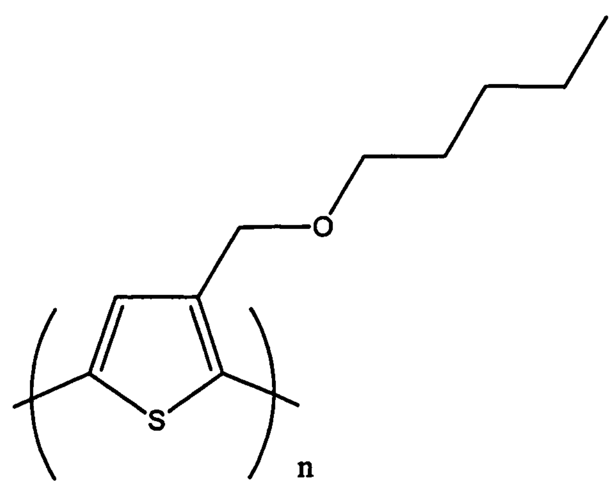
FIG. 3 illustrates poly(3-[β-oxaheptyl]thiophene), poly(3-substituted thiophene) with β hetero substitution.
Figure 4:
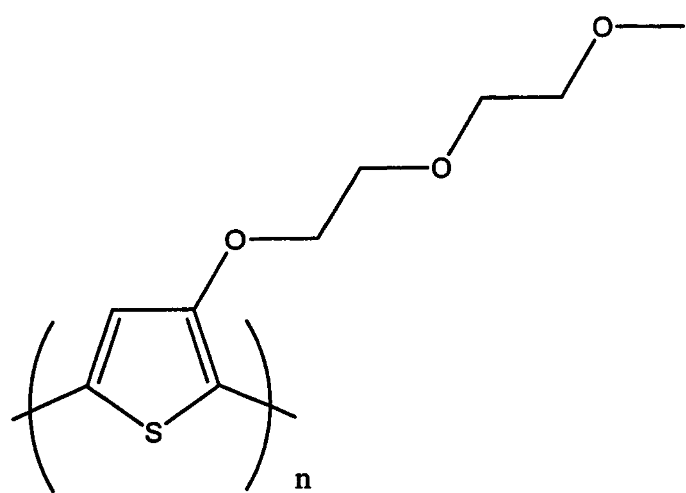
FIG. 4 illustrates poly(3-[α,δ,η-trioxaoctyl]thiophene), poly(3-substituted thiophene) with multiple hetero atom substitutions including an a hetero substitution.
Figure 5:
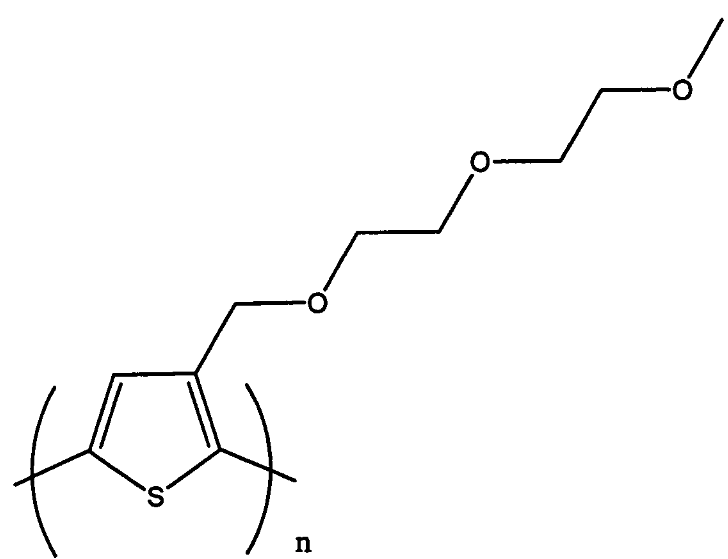
FIG. 5 illustrates poly(3-[β, ϵ, θ-trioxanonyl]thiophene), a poly(3-substituted thiophene) with multiple hetero atom substitutions including a β hetero substitution.
Figure 6:
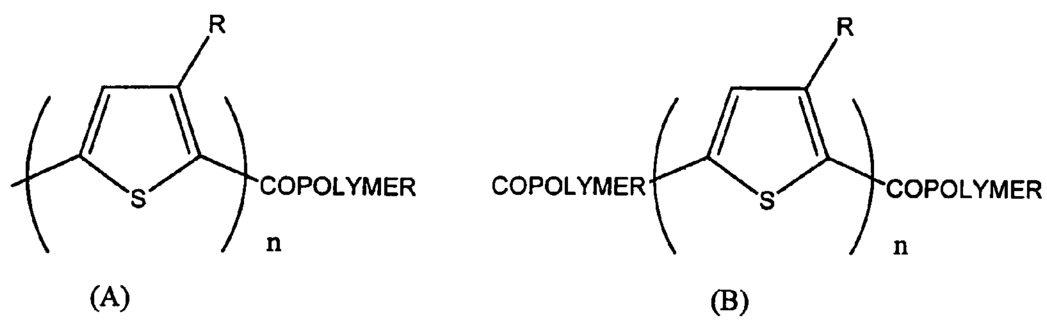
FIG. 6 illustrates a schematic representation of different types of block copolymers including (A) AB type copolymer, and (B) ABA type copolymer, of regio-regular poly(3-substituted)thiophenes; wherein the B unit is a block polythiophene and the A unit is another type of copolymer block.

Priority U.S. provisional application Ser. No. 60/612,640 filed Sep. 24, 2004 is hereby incorporated by reference in its entirety.

U.S. provisional application Ser. No. 60/612,641 also filed Sep. 24, 2004, and U.S. regular application Ser. No. 11/234,373 filed Sep. 26, 2005, for "Heteroatomic Regioregular Poly (3-substitutedthiophenes) in Photovoltaic Cells" are also hereby incorporated by reference in their entirety. These applications generally describe photovoltaic applications of heteroatomically-substituted regioregular polythiophenes.

U.S. provisional application Ser. No. 60/651,211 filed Feb. 10, 2005 ("Hole Injection Layer Compositions") describes additional embodiments which can be used in the practice of the present embodiments and is hereby incorporated by reference in its entirety.

In the nomenclature described below for substitution sites for a heteroatom, the two systems can be used equivalently: (1) α, β, γ, etc. is equivalent to (2) 1, 2, 3, etc.

One embodiment is an electroluminescent device comprising an HIL/HTL layer which comprises at least one polymer comprising a regio-regular poly(3-substitutedthiophene) in which the 3-substituent is an alkyl, aryl, or alkyl/aryl moiety with a heteroatom substitution in either the α- or beta-position of the 3-substituent. Multi-layer devices can be fabricated with many different layering designs. For example two functions can be achieved by one layer providing both of the two functions, or the two functions can be achieved by two separate layers in which each layer provides one of the two functions. As described more fully below, the HIL/HTL layer can be a layer which provides the device with hole injection or hole transport in a multi-layer device. The HIL/HTL layer can be an HIL layer, or it also can be an HTL layer. In addition, as described more fully below, the HIL/HTL layer can comprise materials used for ELL function or anode function, in addition to the regioregular poly(3-substituted polythiophene).

Electroluminescent Devices and Conjugated Polymers Generally

Regioregular poly(3-substitutedthiophenes), both homopolymers and their copolymers, in which the 3-alkyl or aryl substituent possesses heteroatom substitution, can be used as hole injection or hole transport layers in organic or polymer electroluminescent devices.

The use of these materials in electroluminescent devices offers several desirable properties such as increased luminescence of the device, lower threshold voltage, longer lifetime, electron blocking, ease of processability of materials and components during device production, the ability to use spin casting, drop casting, ink-jetting, and other printing techniques to apply the hole injection or hole transport layer in electroluminescent devices, the ability to prepare more flexible electroluminescent devices, the ability to prepare low-weight electroluminescent devices, and the ability to prepare low-cost electroluminescent devices.

For purposes of the present invention, an electroluminescent device is an electrochemical device that converts current to electromagnetic radiation. This is accomplished when an electron and a positive charge or "hole" meet in an electroluminescent material creating an excited state species or exciton which emits a photon when it decays to the ground state. The value of such a device is that it is an efficient way to produce light at low voltage and minimal radiant heat. These devices currently find uses in many consumer electronics.

One example of an electroluminescent device comprises four components. Two of these components are electrodes. The first can be a transparent anode such as indium tin oxide, coated onto a plastic or glass substrate, which functions as a charge carrier and allows emission of the photon from the device by virtue of its required transparency. The second electrode, or cathode, is frequently made of a low work function metal such as calcium or aluminum or both. In some cases this metal may be coated onto a supporting surface such as a plastic or glass sheet. This second electrode conducts or injects electrons into the device. Between these two electrodes are the electroluminescent layer (ELL) and the hole injection or hole transport layer (HIL/HTL).

The third component is an ELL material. The ELL can comprise, for example, materials based on polyphenylene vinylenes, polyfluorenes, and organic-transition metal small molecule complexes. These materials are generally chosen for the efficiency with which they emit photons when an exciton relaxes to the ground state through fluorescence or phosphorescence and for the wavelength or color of the light that they emit through the transparent electrode.

In this embodiment, a fourth component is an HIL/HTL material. The HIL/HTL is a conducting material that is able to transfer a positive charge or "hole" from the transparent anode to the ELL, creating the exciton which in turn leads to light emission. HIL/HTLs are typically p-doped or oxidized conductive materials that are generally chosen for the facility with which they are able to transfer a positive charge to the ELL and the overall efficiency improvement they contribute to the device.

Organic and polymer electroluminescent devices can take a variety of forms. Where the ELL comprises small molecules, typically vacuum deposited, the devices are commonly referred to as OLEDs (Organic Light Emitting Diodes). Where the ELL comprises electroluminescent polymers, typically solution processed and deposited, the devices are commonly referred to as PLEDs (Polymer Light Emitting Diodes). Some ELL layers may not conveniently fit either description, such as mixtures of an electroluminescent material and a solid electrolyte to form a light-emitting electrochemical cell. ELL layers can be designed to emit white light, either for white lighting applications or to be color filtered for a full-color display application. ELL layers can also be designed to emit specific colors, such as red, green, and blue, which can then be combined to create the full spectrum of colors as seen by the human eye.

The LEDs can be combined to make flat panel displays, either monochrome (single color) or full color (large number of colors typically created by combinations of red, green and blue). They may be passive matrix displays, where strips of anode material are deposited orthogonally to strips of cathode material with HIL/HTL and ELL layers in between, such that current flowing through one anode and one cathode strip causes the intersection point to luminesce as a single pixel in a display. Or they may be active matrix displays where transistors at each pixel control whether the individual pixel luminesces and how brightly. Active matrix displays can be either bottom emitting, where the light shines through or beside the transistor circuitry or top emitting where the light shines out in the opposite direction of the layers that contain the transistor circuitry.

Performance of electroluminescent devices can be determined by measurement of the intensity of the light energy that is emitted (candelas per square meter of the electroluminescent device), the efficiency by which current is converted to light (lumens output per watt input), and by the lifetime of the device (thousands of hours). Typical flat panel displays achieve 100-200 Cd/$m^2$, 5,000 to 20,000 hours, and 10-20 lumens/W. The color of light emitted is also an important consideration in the design of these devices and is typically measured by stating the x and y coordinates on the CIE spectrum.

Current materials have several limitations that have generally prevented the ubiquitous use of organic luminescent devices in our society. For example, devices can be limited by lifetime (particularly the blue emitting materials), thermal stability, efficiency, and cost.

A common HIL/HTL in organic electroluminescent devices is poly(3,4-ethylenedioxythiophene) or PEDOT. This material is typically synthesized in the conductive state in the presence of a polymeric acid/oxidant. It has several limitations in that it is not processable in organic solvents, requiring the user to include aqueous dispersions of this materials in what would otherwise be "dry box" conditions for the preparation of organic electroluminescent devices. Because it is perpetually "doped," it is difficult to tune the conductivity of this material. Also, it is difficult to consistently produce uniform films, and the acidic nature is believed to impact both the ITO anode and the ELL materials adversely.

As described herein, p-type, polymer-based HIL/HTLs for electroluminescent devices can show improved properties. These materials offer advantages in that they can be dissolved in common organic solvents and can be easily processed by spin-coating, drop casting, dip coating, spraying, and printing techniques (such as ink-jetting, off-setting, transfer-coating, and other roll-to-roll or coating processes). These materials can be processed in large-area formats opening new applications for organic electroluminescent devices as flexible computer screens, flat screen displays, outdoor advertising or signage, and solid state lighting. Because these materials are manufactured in the neutral state, they can be processed and then oxidized or doped to a level that is suitable for the application. This offers a greater flexibility in device design. The polymer-based materials also offer several other advantages in performance that will be discussed below.

Polythiophene

The below description about polythiophene can be used in the practice of the present invention. It has been shown that, like other conjugated polymers, poly(thiophene) has a conjugated π-electron band structure that makes it a suitable p-type semiconductor for electroluminescent devices. Poly (thiophenes) can be prepared by various chemical and electrochemical transformations of suitably susbstituted thiophenes that result, primarily in the coupling of the thiophene rings at the 2- and 5-positions of the monomer. The degree of other modes of coupling of these thiophene moieties depends on the method employed and can afford polymers and/or oligomers of varying regioregularity. Syntheses of polythiophenes employ methods where the polymer can exhibit nearly 100% of these 2- to 5-couplings, and embues the polymer with beneficial structural features as detailed below.

Performance of these materials as a conductor of holes can be increased when they are doped, or oxidized. Upon oxidation, electrons are removed from the valence band. This change in oxidation state results in the formation of new energy states, called bipolarons. The energy levels are accessible to some of the remaining electrons in the valence band, allowing the polymer to function as a conductor. The extent of this conjugated structure is dependent upon the polymer chains to form a planar conformation in the solid state. This is because conjugation from ring-to-ring is dependent upon π-orbital overlap. If a particular ring is twisted out of planarity, the overlap cannot occur and the conjugation band structure can be lost. Some minor twisting is not detrimental since the degree of overlap between thiophene rings varies as the cosine of the dihedral angle between them.

Performance of a conjugated polymer as a p-type semiconductor can be also dependant upon the morphology of the polymer in the solid state. Electronic properties are dependent upon the electrical connectivity and inter-chain charge transport between polymer chains. Pathways for charge transport can be along a polymer chain or between adjacent chains. Transport along a chain can be improved with a planar backbone conformation due to the dependence of the charge carrying moiety on the amount of double-bond character between the rings. This conduction mechanism between chains can be also improved with either a stacking of planar, polymer segment, called π-stacking, or an inter-chain hopping mechanism in which excitons or electrons can tunnel or "hop" through space or other matrix to another chain that is in proximity to the one that it is leaving. Therefore, processes that can drive ordering of polymer chains in the solid state can help to improve the performance of the conjugated polymer as component of an EL device. The absorbance characteristics of thin films of regioregular polythiophenes can reflect the increased π-stacking which occurs in the solid state.

It has been shown that, like other conjugated polymers, poly(thiophene) has a conjugated π-electron band structure that, upon controlled oxidation, makes it a suitable p-type HIL/HTL for electroluminescent devices. Poly(thiophene) can be prepared by various chemical and electrochemical oxidations of thiophene that result, primarily in the coupling of the thiophene rings at the 2- and 5-positions.

The amount of π-overlap and charge density in this π-system also determines the energy of the π-π* transition for a conjugated polymer and influences the work function of the material in the solid state. Consequently, the nature of the p-type semiconductor determines the efficiency and performance of the organic electroluminescent device.

To effectively use a conjugated polymer as a p-type conductor for this application, it should be prepared by a method that allows the removal of organic and ionic impurities from the polymeric matrix. The presence of impurities, notably metal ions, in this material may have serious deleterious effects on the performance of resulting organic electroluminescent cells. These effects include charge localization or trapping, quenching of the generated excitons, reduction of charge mobility, interfacial morphology effects such as phase separation, and oxidation or reduction of the polymer into an uncontrolled conductive state which is not suitable for HIL/HTL applications. There are several methods by which impurities may be removed from a conjugated polymer. Most of these are facilitated by the ability to dissolve the polymer in common organic and polar solvents. Unfortunately, poly (thiophene) is, essentially, insoluble.

Substituted Polythiophenes

It has been shown that some poly(3-substitutedthiophenes) with alkyl, aryl, and alkyl-aryl substituents are soluble in common organic solvents such as tetrahydrofuran (THF), chloroform, toluene and xylene. These materials share a common conjugated π-electron band structure, similar to that of poly(thiophene) that make them suitable p-type conductors for HIL/HTL applications, but due to their solubility they are much easier to process and purify than poly(thiophene). These materials can be made as oligomer chains such as $(3\text{-alkythiophene})_n$, $(3\text{-arylthiophene})_n$, or $(3\text{alkyl/arylthiophene})_n$ in which n is the number of repeat units with a value of 2-10 or as polymers in which n=11-350 and higher, but for these materials n most typically has a value of 50-200.

However, adding a 3-substituent to the thiophene ring makes the thiophene repeat unit asymmetrical. Polymerization of a 3-substituted thiophene by conventional methods results in 2,5'-couplings, but also in 2,2'- and 5,5'-couplings. The presence of 2,2'-couplings or a mixture of 2,5'-, 2,2'- and 5,5'-couplings can result in steric interactions between 3-substituents on adjacent thiophene rings which can create a tortional strain. The rings then rotate out of a planar conformation to another, thermodynamically more stable, conformation which minimizes the steric interactions from such couplings. This new conformation can include structures where π-overlap is significantly reduced. This results in reduction of π-orbital overlap between adjacent rings, and if severe enough, the net conjugation length decreases and with it the conjugated band structure of the polymer. The combination of these effects can impair the performance as HIL/HTLs made from these regio-randomly coupled poly(3-substitutedthiophenes).

U.S. Pat. No. 4,711,742 to Jen et al. describes the preparation of polythiophenes.

Regioregular Poly(Thiophene) Materials

Materials with superior π-conjugation, electrical communication, and solid state morphology can be prepared by using regiospecific chemical coupling methods that produced greater than 95% 2,5'-couplings of poly(3-substituted thiophenes) with alkyl substituents. These materials can be prepared via the use of a Kumada-type nickel-catalyzed coupling of a 2-bromo-5-magnesiobromo-3-substitutedthiophene as well as by the zinc coupling of a 2-bromo-5-thienylzinc halide which has been reported by Reike. A more practical preparative synthesis of a regio-regular poly(3-substitutedthiophene) with alkyl substituents can be affected by the Grignard metathesis of a 2,5-dibromo-3-alkylthiophene, followed by nickel cross coupling. Additional methods described in the art are purportedly provided by US Patent Publication No. 2005/0080219 to Koller et al.

Like regio-random poly(3-substitutedthiophenes) with alkyl, aryl, and alkyl/aryl substituents, regio-regular poly(3-substitutedthiophenes) with alkyl, aryl, and alkyl/aryl substituents are soluble in common organic solvents and demonstrate enhanced processability in applications by deposition methods such as spin-coating, drop casting, dip coating, spraying, and printing techniques (such as ink-jetting, offsetting, transfer-coating, and other roll-to-roll or coating processes). Therefore, these materials can be better processed in large-area formats as HIL/HTLs for electroluminescent applications when compared to regio-random poly(3-substitutedthiophenes). Furthermore, because of the homogeneity of their 2,5'-ring-to-ring couplings, they exhibit evidence of substantial π-conjugation and high extinction coefficients for the absorption of visible light corresponding to the π-π* absorption for these materials. This absorption determines the quality of the conducting band structure which may be utilized when a regioregular poly(3-substituted thiophene) with alkyl, aryl, or alkyl/aryl substituents is used as an HIL/HTL and, therefore, determines the efficiency and performance of the electroluminescent device.

Another benefit of the regio-regularity of these materials is that they can self-assemble in the solid state and form well-ordered structures. These structures tend to juxtapose thiophene rings systems through a π-stacking motif and allow for improved inter-chain charge transport through this bonding arrangement between separate polymers, enhancing the conductive properties when compared to regio-random polymers. Therefore, one can recognize a morphological benefit to these materials.

As is the case with the use of poly(thiophene) as an HIL/HTL in an electroluminescent device, the presence of impurities, notably metal ions, in this material in large enough amounts may have serious deleterious effects on the performance of polythiophene-containing electroluminescent devices. These effects can include one or more of the following: charge localization or trapping, quenching of the formed excitons, reduction of charge mobility, interfacial morphology effects such as phase separation, and oxidation or reduction of the polymer into a more highly an uncontrolled conductive state which is not suitable for electroluminescent applications. There are several methods by which impurities may be removed from a conjugated polymer and brought to acceptable levels. Most of these are facilitated by the ability to dissolve the polymer in common organic and polar solvents. The solubility of these materials facilitates their purification such that they can be made suitable for their application as HIL/HTLs for electroluminescent devices.

These materials can be made as oligomer chains such as $(3\text{-alkythiophene})_n$, $(3\text{-arylthiophene})_n$, or $(3\text{-alkyl/arylthiophene})_n$ in which n is the number of repeat units with a value of 2-10 or as polymers in which n=11-350 and higher, but for these materials n most typically has a value of 50-200.

The degree of regioregularity can be, for example, about 90% or more, or about 95% or more, or about 98% or more.

Heterosysnthesis

Synthetic methods, doping, and polymer characterization, including regioregular polythiophenes with heteroatoms in the side groups, is provided in, for example, U.S. Pat. Nos. 6,602,974 to McCullough et al. and 6,166,172 to McCullough et al., which are hereby incorporated by reference in their entirety. Additional description can be found in the article, "The Chemistry of Conducting Polythiophenes," by Richard D. McCullough, *Adv. Mat.,* 10, No. 2, pages 93-116, and references cited therein, which is hereby incorporated by reference in its entirety. In particular, section 4 describes "Chemical Synthesis of Heteroatomic Functionalized Substituents on PTs: Recognition Sites for Self-Assembly and Chemical Sensing."

Another reference which one skilled in the art can use is the *Handbook of Conducting Polymers, 2nd Ed.,* 1998, Chapter 9, by McCullough et al., "Regioregular, Head-to-Tail Coupled Poly(3-alkylthiophene) and its Derivatives," pages 225-258, which is hereby incorporated by reference in its entirety. In particular, section VI describes heteroatomic substituents on HT PATs including ether groups and thioalkyl groups.

This reference also describes, in chapter 29, "Electroluminescence in Conjugated Polymers" at pages 823-846, which is hereby incorporated by reference in its entirety.

In addition, electrically conductive polymers are described in *The Encyclopedia of Polymer Science and Engineering*, Wiley, 1990, pages 298-300, including polyacetylene, poly (p-phenylene), poly(p-phenylene sulfide), polypyrrole, and polythiophene, which is hereby incorporated by reference in its entirety. This reference also describes blending and copolymerization of polymers, including block copolymer formation. Blended polymer systems can be used.

Oxygen in Alpha Position

In particular, regio-regular poly(3-substitutedthiophenes) with alkyl, aryl, and alkyl/aryl substituents and an oxygen atom in the α-position of the 3-substituent can also be prepared by the McCullough (nickel cross-coupling of 2-bromo-5-(magnesiobromo)-3-(alkoxythiophene)) and GRIM (Grignard metathesis of a 2,5-dibromo-3-(alkoxythiophene)

followed by a nickel cross-coupling reaction) methods. Specific examples of this class of materials include poly(3-substitutedthiophenes) with 1-oxaheptyl and 1,4,7-trioxaoctyl substituents. In some instances, the 3-substitutent may contain a heteroatom other than oxygen (e.g, S) in addition to an oxygen atom in the α-position. The amount of regio-regular 2,5'-couplings for these materials can exceed 95%.

Regio-regular poly(3-substitutedthiophenes) with alkyl, aryl, and alkyl/aryl substituents and an oxygen atom in the α-position of the 3-substituent demonstrate the same enhanced performance as other regio-regular poly(3-substituted) thiophenes with alkyl, aryl, and alkyl/aryl with regard to processability, defect-free electronic structure, high extinction coefficient, high electronic mobility, and improved solid-state morphology. Furthermore, the heteroatom functionality increases the solubility of this material in polar organic solvents like tetrahydrofuran, dimethylformamide (DMF), 1-methoxy-2-propanol acetate (PMA), and chloroform, which enhances the processing options for this material and allowing the selective dissolution of this layer in the presence of other device components. Stability can be improved particularly in the doped form with the heteroatomic substitution. Another example of solvent is halobenzenes such as chlorobenzene.

As is the case with the use of poly(thiophene) as an HIL/HTL in an electroluminescent device, the presence of impurities, notably metal ions, in this material at high enough levels may have serious deleterious effects on the performance of polythiophene-containing electroluminescent devices. These effects can include one or more of the following: charge localization or trapping, quenching of the formed excitons, reduction of charge mobility, interfacial morphology effects such as phase separation, and oxidation or reduction of the polymer into a more highly conductive state which is not suitable for electroluminescent applications. There are several methods by which impurities may be removed from a conjugated polymer. Most of these are facilitated by the ability to dissolve the polymer in common organic and polar solvents. The solubility of these materials facilitates their purification such that they can be made suitable for their application as HIL/HTLs for electroluminescent devices.

These materials can be made as oligomer chains such as $(3\text{-alkoxythiophene})_n$, $(3\text{-aryloxythiophene})_n$, or $(3\text{alkyl/aryloxythiophene})_n$ in which n is the number of repeat units with a value of 2-10 or as polymers in which n=11-350 and higher, but for these materials n most typically has a value of 50-200 when used as a p-type semiconductor in a organic electroluminescent device.

Oxygen in Beta Position

Regio-regular poly(3-substitutedthiophenes) with alkyl, aryl, and alkyl/aryl substituents and an oxygen atom in the β-position of the 3-substituent has also been prepared by the McCullough (nickel cross-coupling of 2-bromo-5-magnesiobromo-3-alkoxythiophene) and GRIM (Grignard metathesis of a 2,5-dibromo-3-alkoxythiophene followed by a nickel cross-coupling reaction) methods. Specific examples of this class of materials include poly(3-substitutedthiophenes) with 2,5-dioxahexyl and 2,5,8-trioxanonyl substituents. In some instances, the 3-substitutent may contain a heteroatom other than oxygen in addition to an oxygen atom in the α-position. The amount of regio-regular 2,5'-couplings for these materials can exceed 95%.

Regio-regular poly(3-substitutedthiophenes) with alkyl, aryl, and alkyl/aryl substituents and an oxygen atom in the β-position of the 3-substituent demonstrate the same enhanced performance as other regio-regular poly(3-substituted) thiophenes with alkyl, aryl, and alkyl/aryl with regard to processability, defect-free electronic structure, high extinction coefficient, high electronic mobility, improved solid-state morphology. Furthermore, the heteroatom functionality increases the solubility of this material in polar organic solvents like tetrahydrofuran, dimethylformamide (DMF), 1-methoxy-2-propanol acetate (PMA), and chloroform, which enhances the processing options for this material and allowing the selective dissolution of this layer in the presence of other device components.

As is the case with the use poly(thiophene) as an HIL/HTL in an electroluminescent device, the presence of impurities, notably metal ions, in this material may have serious deleterious effects on the performance of polythiophene-containing electroluminescent devices. These effects can include one or more of the following: charge localization or trapping, quenching of the formed excitons, reduction of charge mobility, interfacial morphology effects such as phase separation, and oxidation or reduction of the polymer into a more highly conductive state which is not suitable for electroluminescent applications. There are several methods by which impurities may be removed from a conjugated polymer. Most of these are facilitated by the ability to dissolve the polymer in common organic and polar solvents. The solubility of these materials facilitates their purification such that they can be made suitable for their application as HIL/HTLs for electroluminescent devices.

These materials can be made as oligomer chains such as $(3\text{-}\beta\text{-alkyloxathiophene})_n$, $(3\text{-}\beta\text{-aryloxathiophene})_n$, or $(3\text{-}\beta\text{-alkyl/aryloxathiophene})_n$ in which n is the number of repeat units with a value of 2-10 and or as polymers in which n=11-350 and higher, but for these materials n most typically has a value of 50-200.

Heteroatom in Alpha Position

Regio-regular poly(3-substituted thiophenes) with alkyl, aryl, and alkyl/aryl substituents and a hetero atom in the α-position of the 3-substituent has also been prepared by the McCullough (nickel cross-coupling of 2-bromo-5-magnesiobromo-3-α-heteroalkylthiophene) and GRIM (Grignard metathesis of a 2,5-dibromo-3-α-heteroalkylthiophene) followed by a nickel cross-coupling reaction) methods. Specific examples of this class of materials include poly(3-substituted thiophenes) with 1-thiaheptyl substituent. In some instances, the 3-substitutent may contain a heteroatom other than heteroatom in addition to a hetero atom in the α-position. The amount of regio-regular 2,5'-couplings for these materials can exceed 95%.

Regio-regular poly(3-substitutedthiophenes) with alkyl, aryl, and alkyl/aryl substituents and a hetero atom in the α-position of the 3-substituent demonstrate the same enhanced performance as other regio-regular poly(3-substituted) thiophenes with alkyl, aryl, and alkyl/aryl with regard to processability, defect-free electronic structure, high extinction coefficient, high electronic mobility, improved solid-state morphology. Furthermore, the heteroatom finctionality increases the solubility of this material in polar organic solvents like tetrahydrofuran, dimethylformamide (DMF), 1-methoxy-2-propanol acetate (PMA), and chloroform, which enhances the processing options for this material and allowing the selective dissolution of this layer in the presence of other device components.

As is the case with the use poly(thiophene) as an HIL/HTL in an electroluminescent device, the presence of impurities, notably metal ions, in this material may have serious deleterious effects on the performance of polythiophene-containing electroluminescent devices. These effects can include one or more of the following: charge localization or trapping, quenching of the formed excitons, reduction of charge mobility, interfacial morphology effects such as phase separation, and oxidation or reduction of the polymer into a more highly conductive state which is not suitable for electroluminescent applications. There are several methods by which impurities may be removed from a conjugated polymer. Most of these are facilitated by the ability to dissolve the polymer in common organic and polar solvents. The solubility of these materials facilitates their purification such that they can be made suitable for their application as HIL/HTLs for electroluminescent devices.

These materials can be made as oligomer chains such as (3-α-heteroalkylthiophene)$_n$, (3-α-heteroarylthiophene)$_n$, or (3-α-heteroalkyl/arylthiophene)$_n$ in which n is the number of repeat units with a value of 2-10 or as polymers in which n=11-350 and higher, but for these materials n most typically has a value of 50-200.

Heteroatom in Beta Position

Regio-regular poly(3-substitutedthiophenes) with alkyl, aryl, and alkyl/aryl substituents and a hetero atom in the β-position of the 3-substituent has also been prepared by the McCullough (nickel cross-coupling of 2-bromo-5-magnesiobromo)-3-β-heteroalkylthiophene) and GRIM (Grignard metathesis of a 2,5-dibromo-3-β-heteroalkylthiophene) followed by a nickel cross-coupling reaction) methods. Specific examples of this class of materials include poly(3-substitutedthiophenes) with 2-thiaoctyl substituent. In some instances, the 3-substitutent may contain a heteroatom other than the heteroatom in the β-position. The amount of regioregular 2,5'-couplings for these materials can exceed 95%.

Regio-regular poly(3-substitutedthiophenes) with alkyl, aryl, and alkyl/aryl substituents and a hetero atom in the β-position of the 3-substituent demonstrate the same enhanced performance as other regio-regular poly(3-substituted) thiophenes with alkyl, aryl, and alkyl/aryl with regard to processability, defect-free electronic structure, high extinction coefficient, high electronic mobility, improved solid-state morphology. Furthermore, the heteroatom functionality increases the solubility of this material in polar organic solvents like tetrahydrofuran, dimethylformamide (DMF), 1-methoxy-2-propanol acetate (PMA), and chloroform, which enhances the processing options for this material and allowing the selective dissolution of this layer in the presence of other device components.

As is the case with the use poly(thiophene) as an HIL/HTL in an electroluminescent device, the presence of impurities, notably metal ions, in this material may have serious deleterious effects on the performance of polythiophene-containing electroluminescent devices. These effects can include one or more of the following: charge localization or trapping, quenching of the formed excitons, reduction of charge mobility, interfacial morphology effects such as phase separation, and oxidation or reduction of the polymer into a more highly conductive state which is not suitable for electroluminescent applications. There are several methods by which impurities may be removed from a conjugated polymer. Most of these are facilitated by the ability to dissolve the polymer in common organic and polar solvents. The solubility of these materials facilitates their purification such that they can be made suitable for their application as HIL/HTLs for electroluminescent devices.

These materials can be made as oligomer chains such as (3-β-heteroalkylthiophene)$_n$, (3-β-heteroarylthiophene)$_n$, or (3-β-heteroalkyl/arylthiophene)$_n$ in which n is the number of repeat units with a value of 2-10 or as polymers in which n=11-350 and higher, but for these materials n most typically has a value of 50-200.

Doping

The use of a regio-regular poly(3-substitutedthiophene) in which the 3-substitutent is an alkyl, aryl, or alkyl/aryl moiety with an oxygen substitution in either the α- or β-position of the 3-substituent or a hetero atom in either the α- or β-position of the 3-substituent as well as copolymers of these materials as an HIL/HTL layer in an organic electroluminescent device can comprise a controlled oxidation or "doping" of the polymer to obtain the desired conductive state that is important for performance. Upon oxidation, electrons are removed from the valence band. This change in oxidation state results in the formation of new energy states, called bipolarons. The energy levels are accessible to some of the remaining electrons in the valence band, allowing the polymer to fimction as a conductor. It is this oxidative or p-type conductive state that can allow this material to function as an HIL/HTL.

In an electroluminescent device the conductivity of the HIL/HTL can range from about $10^{-7}$ to about $10^{2}$ S/cm but most typically it is in the range of about $10^{-5}$ to about $10^{-3}$ S/cm. In the case of regio-regular poly(3-substituted thiophenes) in which the 3-substitutent is an alkyl, aryl, or alkyl/aryl moiety with an oxygen substitution in either the α- or β-position of the 3-substituent or a hetero atom in either the α- or β-position of the 3-substituent, the important characteristics of the conducting HIL/HTL layer are that they retain their conductivity for thousands of hours at ambient temperatures and meet suitable device stress tests at elevated temperatures and/or humidity. Another value is that, in the doped state, these materials show a high transmissivity that is greater than 80% in the visible region and a lowered band gap. This facilitates an operational range of robust charge mobility and allows the tuning of properties by controlling the amount and identity of the doping species and complements the ability to tune these properties by the tuning of the primary structure.

There are many oxidants which may be used to tune conductive properties. Molecular halogens such as bromine, iodine, and chlorine offer some advantages. By controlling the amount of exposure of the dopant to the polymer the resulting conductivity of the HIL/HTL can be controlled. Because of their high vapor pressure and solubility in organic solvents, halogens may be applied in the gas phase or in solution. Oxidation of the polymer can reduce the solubility of the material relative to that of the neutral state. Nevertheless, some solutions may be prepared and coated onto devices.

Other examples include bromine, iodine, chlorine, iron trichloride, gold trichloride, arsenic pentafluoride, alkali metal salts of hypochlorite, protic acids such as benzenesulfonic acid and derivatives thereof, proprionic acid, and other organic carboxylic and sulfonic acids, nitrosonium salts such as $NOPF_6$ or $NOBF_4$, or organic oxidants such as tetracyanoquinone, dichlorodicyanoquinone, and hypervalent iodine oxidants such as iodosylbenzene and iodobenzene diacetate Some Lewis acid oxidants such as iron trichloride, gold trichloride, and arsenic pentafluoride have been used to dope poly(3-substituted thiophenes) via a redox reaction. These dopants have been reported to result in the formation of stable, conductive films. This is primarily accomplished through the treatment of the cast film to a solution of the metal chloride, albeit the casting of doped films is possible but is rarely reported Protic organic and inorganic acids such as benzenesulfonic acid and derivatives thereof, proprionic acid, other organic carboxylic and sulfonic acids, and mineral acids such as nitric, sulfuric and hydrochloric can be used to dope poly(3-substituted thiophenes).

Nitrosonium salts such as $NOPF_6$ and $NOBF_4$ can be used to dope poly(3-substitutedthiophenes) by a reaction which produces the stable nitric oxide molecule in an irreversible redox reaction.

Organic oxidants such tetracyanoquinone, dichlorodicyanoquinone, and hypervalent iodine oxidants such as iodosylbenzene and iodobenzene diacetate can be used. Organic oxidants can be, for example, an aryl sulfonic acid, a benzoquinone derivative, or a quinone oxidant. Mixtures can be used. One mixture which can be used is p-TSA and BQ. Non-acidic organic dopants can be used. Although the present description is not limited by theory, it is believed that it is good for stability to have irreversible doping reactions to provide good stability in the doped state.

Examples include pTSA (p-Toluenesulfonic Acid); DDQ (2,3-Dichloro-5,6-dicyano-1,4-benzoquinone); NQ (1,4-napthoquinone); DNNDSA (Dinonylnaphthalenedisulfonic acid) DNDSA (Dinonylnaphthalenesulfonic acid); TCQ (2,3,4,5-tetrachloroquinone); TFQ (2,3,4,5-tetraflurorquinone); BQ (1,4-benzoquinone); MESA (Methanesulfonic acid);F4-TCNQ (2,3,5,6-tetrafluoro-7,7,8,8-tetracyanoquinodimethane); and TCNQ (7,7,8,8-tetracyanoquinodimethane).

Doping can be carried out in solution or in the solid state. The amount of dopant can be varied to determine how much dopant is needed to achieve the best or the maximum oxidation. Disappearance of a large absorption band around 500 nm can be monitored.

Additional Embodiments

Regio-regular poly(3-substitutedthiophene) in which the 3-substitutent is an alkyl, aryl, or alkyl/aryl moiety with an oxygen substitution in either the α- or β-position of the 3-substituent or a hetero atom in either the α- or β-position of the 3-substituent as well as copolymers of these materials can be used as an HIL/HTL layer in an organic electroluminescent device.

A copolymer of these materials can be a homo-, block-, alternating-, and random-copolymers of which incorporate one or more of the materials defined as a regio-regular poly (3-substitutedthiophene) in which the 3-substitutent is an alkyl, aryl, or alkyl/aryl moiety with an oxygen substitution in either the α- or β-position of the 3-substituent or a hetero atom in either the α- or β-position of the 3-substituent or as a copolymer of a regio-regular poly(3-substitutedthiophene) in which the 3-substitutent is an alkyl, aryl, or alkyl/aryl moiety with an oxygen substitution in either the α- or β-position of the 3-substituent or a hetero atom in either the α- or β-position of the 3-substituent with blocks composed of polymers built from monomers such as $CH_2CH$ Ar, where Ar=any aryl or functionalized aryl group, isocyanates, ethylene oxides, conjugated dienes, $CH_2CH_2R$ where R=H, alkyl, Cl, ,Br, F, OH, lactam, lactone, siloxanes, and ATRP macroinitiators.

A copolymer also can be a random or well-defined copolymer comprising a regio-regular poly(3-substitutedthiophene) in which the 3-substitutent is an alkyl, aryl, or alkyl/aryl moiety with an oxygen substitution in either the α- or β-position of the 3-substituent or a hetero atom in either the α- or β-position of the 3-substituent or as a copolymer of a regio-regular poly(3-substitutedthiophene) in which the 3-substitutent is an alkyl, aryl, or alkyl/aryl moiety with an oxygen substitution in either the α- or β-position of the 3-substituent or a hetero atom in either the α- or β-position of the 3-substituent with a block comprised of one or more functionalized thiophene derivatives, or as a regio-regular poly(3-substitutedthiophene) in which the 3-substitutent is an alkyl, aryl, or alkyl/aryl moiety with an oxygen substitution in either the α- or β-position of the 3-substituent or a hetero atom in either the α- or β-position of the 3-substituent or as a copolymer of a regio-regular poly(3-substitutedthiophene) in which the 3-substitutent is an alkyl, aryl, or alkyl/aryl moiety with an oxygen substitution in either the α- or β-position of the 3-substituent or a hetero atom in either the α- or β-position of the 3-substituent as a copolymer with random or well-defined copolymer comprised of one or more thiophene units.

A copolymer can be a regio-regular poly(3-substitutedthiophene) in which the 3-substitutent is an alkyl, aryl, or alkyl/aryl moiety with an oxygen substitution in either the α- or β-position of the 3-substituent or a hetero atom in either the α- or β-position of the 3-substituent or as a copolymer of a regio-regular poly(3-substitutedthiophene) in which the 3-substitutent is an alkyl, aryl, or alkyl/aryl moiety with an oxygen substitution in either the α- or β-position of the 3-substituent or a hetero atom in either the α- or β-position of the 3-substituent with blocks of random or well-defined polymer comprised of one or more functionalized oligothiophenes which is also random or well defined.

An electroluminescent device can be fabricated which can be a device which emits photons through fluorescent and/or phosphorescent processes when an external current is applied. The device can have, at a minimum, two electrodes across which a potential is applied to power the device, and a luminescent material in between which is responsible for emitting the light.

A passive matrix device can be fabricated which can be a device including a matrix of light emitting diode pixels where any one individual pixel is illuminated by powering a specific strip of anode and cathode wherein the chosen pixel forms the intersection of the two electrodes.

An active matrix can be fabricated which is a device including a matrix of light emitting diode pixels where any one individual pixel is illuminated by controlling one or more transistors collocated above, below, or adjacent to the pixel which acts as a switch to control the pixel and supply the necessary current to power the pixel.

A top emitting electroluminescent device can be fabricated which is an active matrix device in which the light is emitted in the direction opposite to the layer or layers of the device that contain the controlling transistor circuitry.

A bottom emitting electroluminescent device can be fabricated which is an active matrix device in which the light is emitted in the direction of the layer or layers of the device that contain the controlling transistor circuitry, shining either through or adjacent the circuitry.

An HIL can be a component of an electroluminescent device that carries positive charge from an electrode either directly to an electroluminescent material or to a subsequent HTL material and is comprised of a discrete monolithic layer, or a blend or mixture of materials that have the following functionality such as: two or more polymeric or molecular HILs, an HIL with an electroluminescent material, or an HIL with a conductive or non-conductive filler of processing aid. It may also be one or more HIL active materials that are organized into a discrete structural unit or array or a combination of HIL active materials in which one or both materials are bound to a non-active organizing matrix such as a polymer or supramolecular scaffold.

An HTL can be a component of an electroluminescent device that carries positive charge from an HIL or an HTL either directly to an electroluminescent material or to a subsequent HTL material and is comprised of a discrete monolithic layer, or a blend or mixture of materials that have the following functionality such as: two or more polymeric or molecular HTLs, an HTL with an electroluminescent material, or an HTL with a conductive or non-conductive filler of processing aid. It may also be one or more HTL active materials that are organized into a discrete structural unit or array or a combination of HTL active materials in which one or both materials are bound to a non-active organizing matrix such as a polymer or supramolecular scaffold.

The HIL/HTL may be manufactured by spin casting, drop casting, vapor deposition or sputtering, dip coating, or by printing techniques such as ink-jetting, off-setting, a transfer process, or by spray applications.

More Additional Embodiments

Figure 7:
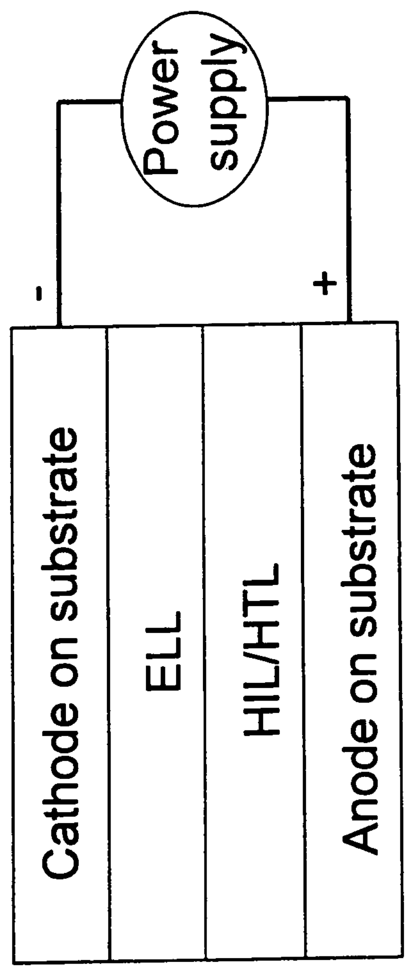
FIG. 7 illustrates embodiment 1 for an EL device having two anodes between the electrodes.

A first embodiment of this invention is an electroluminescent device wherein the HIL/HTL comprises a regio-regular poly(3-substitutedthiophene) in which the 3-substitutent is an alkyl, aryl, or alkyl/aryl moiety with an oxygen substitution in either the α- or β-position of the 3-substituent or a hetero atom in either the α- or β-position of the 3-substituent as well as copolymers of these materials which is undoped or has been doped with, for example, bromine, iodine, chlorine, iron trichloride, gold trichloride, arsenic pentafluoride, a protic acid, nitrosonium salts such as $NOPF_6$ or $NOBF_4$, or organic oxidants. FIG. 7 provides an illustration.

Figure 8:
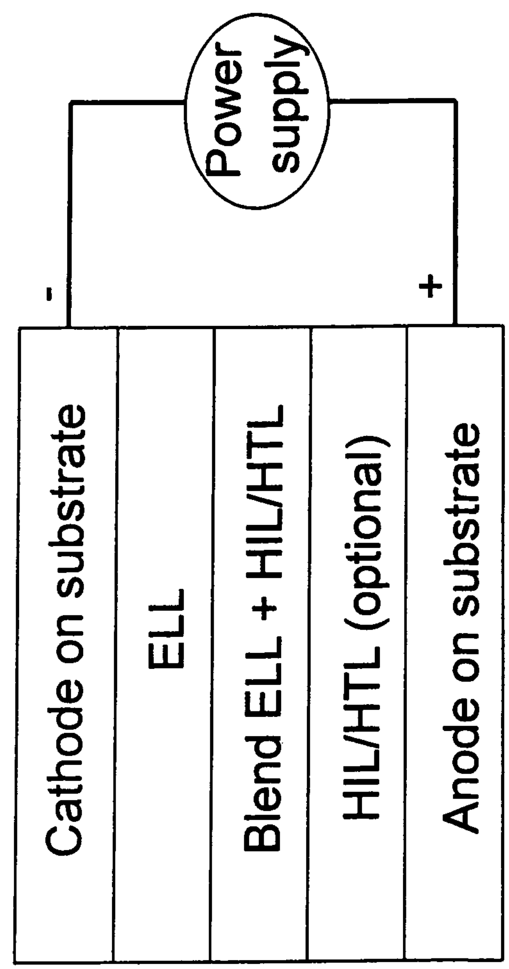
FIG. 8 illustrates embodiment 2 for an EL device.

Another second embodiment of this invention is an electroluminescent device wherein the HIL/HTL comprises a regio-regular poly(3-substitutedthiophene) in which the 3-substitutent is an alkyl, aryl, or alkyl/aryl moiety with an oxygen substitution in either the α- or β-position of the 3-substituent or a hetero atom in either the α- or β-position of the 3-substituent as well as copolymers of these materials which is undoped or has been doped with, for example, bromine, iodine, chlorine, iron trichloride, gold trichloride, arsenic pentafluoride, a protic acid, nitrosonium salts such as $NOPF_6$ or $NOBF_4$, or organic oxidants that has been blended with an EL material and applied as a transition layer between an unblended ELL and an unblended HIL/HTL or anode. Appropriate EL materials include both small molecule and polymer electroluminescent materials. FIG. 8 provides an illustration.

Figure 9:
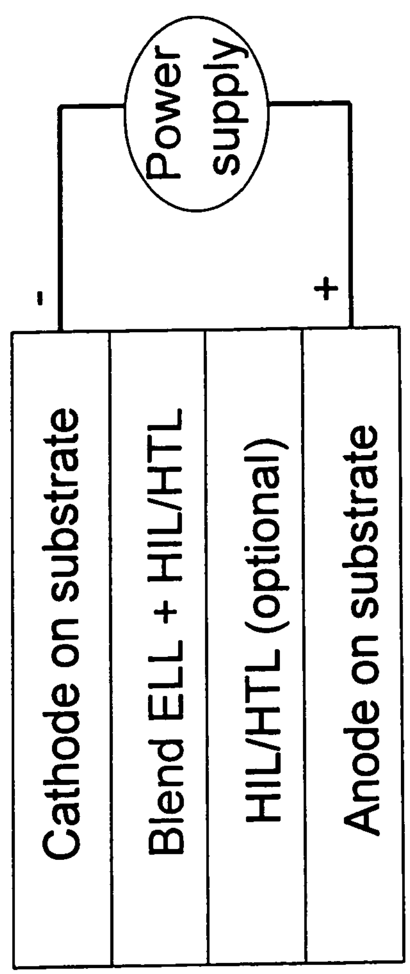
FIG. 9 illustrates embodiment 3 for an EL device.

Another third embodiment of this invention is an electroluminescent device wherein the HIL/HTL comprises a regio-regular poly(3-substitutedthiophene) in which the 3-substitutent is an alkyl, aryl, or alkyl/aryl moiety with an oxygen substitution in either the α- or β-position of the 3-substituent or a hetero atom in either the α- or β-position of the 3-substituent as well as copolymers of these materials which is undoped or has been doped with, for example, bromine, iodine, chlorine, iron trichloride, gold trichloride, arsenic pentafluoride, a protic acid, nitrosonium salts such as $NOPF_6$ or $NOBF_4$, or organic oxidants that has been fully blended with an EL material and applied directly on an HIL/HTL or anode. Appropriate EL materials include both small molecule and polymer electroluminescent materials. FIG. 9 provides an illustration.

Figure 10:
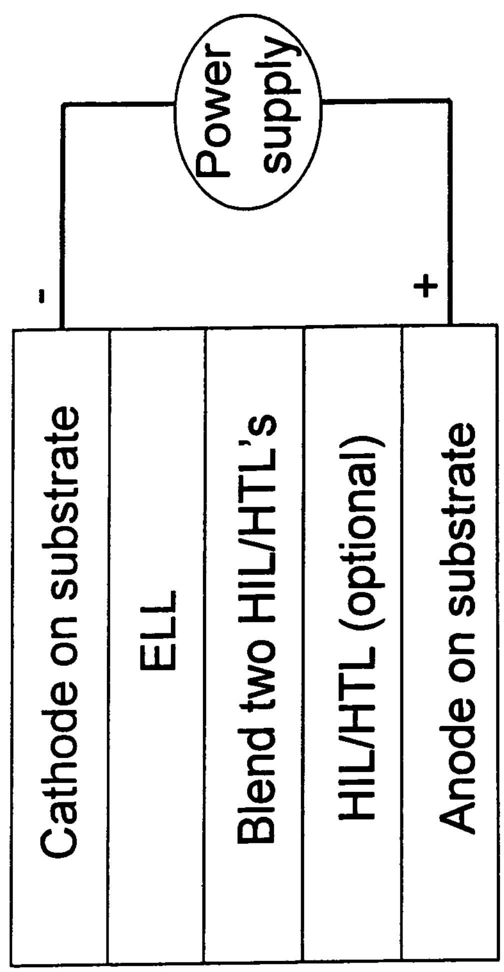
FIG. 10 illustrates embodiment 4 for an EL device.

Another fourth embodiment of this invention is an electroluminescent device wherein the HIL/HTL comprises a regio-regular poly(3-substitutedthiophene) in which the 3-substitutent is an alkyl, aryl, or alkyl/aryl moiety with an oxygen substitution in either the α- or β-position of the 3-substituent or a hetero atom in either the α- or β-position of the 3-substituent as well as copolymers of these materials which is undoped or has been doped with, for example, bromine, iodine, chlorine, iron trichloride, gold trichloride, arsenic pentafluoride, a protic acid, nitrosonium salts such as $NOPF_6$ or $NOBF_4$, or organic oxidants that has been blended with another HIL/HTL material and applied as a transition layer between an unblended ELL and an unblended HIL/HTL or anode. Appropriate HIL/HTL materials include both small molecule and polymer materials. FIG. 10 provides an illustration.

Figure 11:
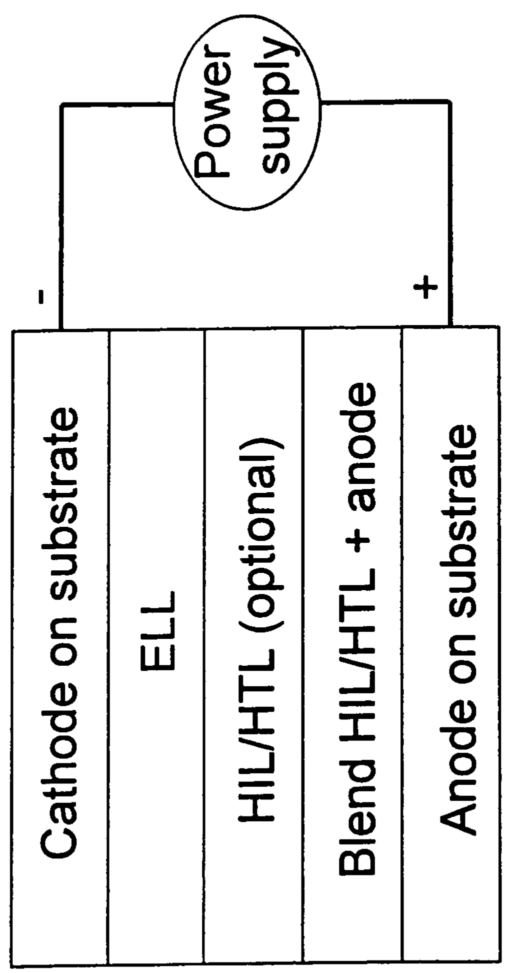
FIG. 11 illustrates embodiment 5 for an EL device.

Another fifth embodiment of this invention is an electroluminescent device wherein the HIL/HTL comprises a regio-regular poly(3-substitutedthiophene) in which the 3-substitutent is an alkyl, aryl, or alkyl/aryl moiety with an oxygen substitution in either the α- or β-position of the 3-substituent or a hetero atom in either the α- or β-position of the 3-substituent as well as copolymers of these materials which is undoped or has been doped with, for example, bromine, iodine, chlorine, iron trichloride, gold trichloride, arsenic pentafluoride, a protic acid, nitrosonium salts such as $NOPF_6$ or $NOBF_4$, or organic oxidants that has been blended with a polymeric anode material and applied as a transition layer between an unblended polymeric anode and an unblended HIL/HTL or ELL. Appropriate polymeric anode materials include highly conductive and transparent conductive polymers such as those based on PEDOT, poly(3-substituted) thiophenes, poly(3-substituted)thienylene vinylenes, polyaniline, polyphenylenevinylene, poly(N-substituted)pyrroles, and polyacetylene. FIG. 11 provides an illustration.

Figure 12:
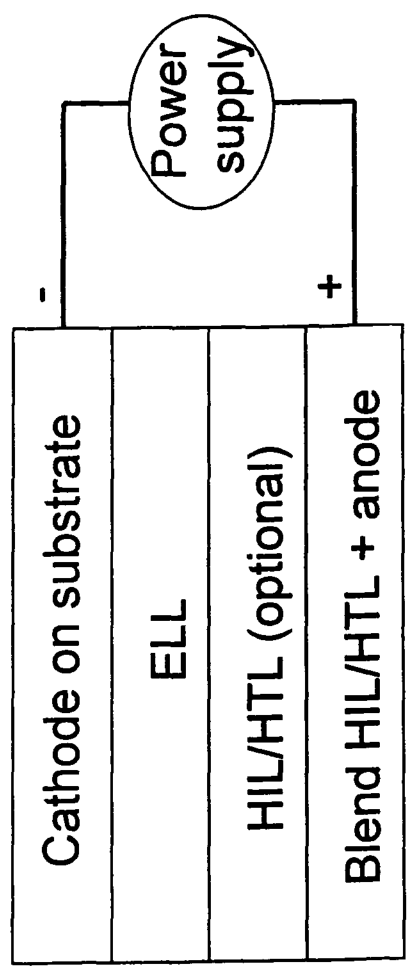
FIG. 12 illustrates embodiment 6 for an EL device.

Another sixth embodiment of this invention is an electroluminescent device wherein the HIL/HTL comprises a regio-regular poly(3-substitutedthiophene) in which the 3-substitutent is an alkyl, aryl, or alkyl/aryl moiety with an oxygen substitution in either the α- or β-position of the 3-substituent or a hetero atom in either the α- or β-position of the 3-substituent as well as copolymers of these materials which is undoped or has been doped with, for example, bromine, iodine, chlorine, iron trichloride, gold trichloride, arsenic pentafluoride, a protic acid, nitrosonium salts such as $NOPF_6$ or $NOBF_4$, or organic oxidants that has been fully blended with a polymeric anode material and such that it conducts directly to an unblended HIL/HTL or ELL. Appropriate polymeric anode materials include highly conductive and transparent conductive polymers including those based on PEDOT, poly(3-substituted)thiophenes, poly(3-substituted) thienylene vinylenes, polyaniline, polyphenylenevinylene, poly(N-substituted)pyrroles, and polyacetylene. FIG. 12 provides an illustration.

Another seventh embodiment of this invention is a passive-matrix electroluminescent device wherein the HIL/HTL comprises a regio-regular poly(3-substitutedthiophene) in which the 3-substitutent is an alkyl, aryl, or alkyl/aryl moiety with an oxygen substitution in either the α- or β-position of the 3-substituent or a hetero atom in either the α- or β-position of the 3-substituent as well as copolymers of these materials which is undoped or has been doped with bromine, iodine, chlorine, iron trichloride, gold trichloride, arsenic pentafluoride, a protic acid, nitrosonium salts such as $NOPF_6$ or $NOBF_4$, or organic oxidants.

Another eighth embodiment of this invention is a bottom-emitting, active-matrix electroluminescent device wherein the HIL/HTL comprises a regio-regular poly(3-substitutedthiophene) in which the 3-substitutent is an alkyl, aryl, or alkyl/aryl moiety with an oxygen substitution in either the α- or β-position of the 3-substituent or a hetero atom in either the α- or β-position of the 3-substituent as well as copolymers of these materials which is undoped or has been doped with bromine, iodine, chlorine, iron trichloride, gold trichloride, arsenic pentafluoride, a protic acid, nitrosonium salts such as $NOPF_6$ or $NOBF_4$, or organic oxidants.

Another ninth embodiment of this invention is a top-emitting, active-matrix electroluminescent device wherein the HIL/HTL is comprised of a regio-regular poly(3-substitutedthiophene) in which the 3-substitutent is an alkyl, aryl, or alkyl/aryl moiety with an oxygen substitution in either the α- or β-position of the 3-substituent or a hetero atom in either the α- or β-position of the 3-substituent as well as copolymers of these materials which is undoped or has been doped with bromine, iodine, chlorine, iron trichloride, gold trichloride, arsenic pentafluoride, a protic acid, nitrosonium salts such as $NOPF_6$ or $NOBF_4$, or organic oxidants.

In an tenth embodiment, the 4 position of the thiophene ring can also be substituted. The substitution at the 4 position can provide the same substituent as that at the 3 position, providing a symmetrical substitution pattern. Or the 3 and 4 substitution can provide different substituents and an asymmetrical substitution pattern. Examples of groups which can be used as a substituent at the 4 position include alkyl, aryl, and alkylaryl groups including methyl, ethyl, propyl, butyl, and the like. Other examples include any of the substituents described herein for the 3 position, including those with heteroatoms.

In an eleventh embodiment, the HIL and ELL materials are bonded to each other. The bonding can be ionic or covalent bonding. Coordinate bonding can be used. For example, one material can have a nucleophilic group and the other material can have an electrophilic group which can react with each other to form a covalent linkage. Covalent bonding methods are known in the art including, for example, reactions of amines with aldehydes, carboxylic acids, or esters.

Good performance of an electroluminescent device containing an HIL/HTLcomprising a regio-regular poly(3-substitutedthiophene) in which the 3-substitutent is an alkyl, aryl, or alkyl/aryl moiety with an oxygen substitution in either the α- or β-position of the 3-substituent or a hetero atom in either the α- or β-position of the 3-substituent as well as copolymers can be achieved when the p-type material is in a controlled conductive state (which may include the undoped semiconductive state). Contamination of the p-type material with metallic impurities and other impurities can be controlled so that it does not exceed about 1,000 ppm, or more particularly, does not exceed about 500 ppm. Even more preferred is an impurity level of about 150 ppm or less. Impurity levels can be measured by atomic absorption spectroscopy, photoinduced x-ray emission analysis, and other methods known in the art.

Preferred Embodiments

The following represent additional preferred embodiments which can be practiced by one skilled in the art:

1) The use of a regio-regular poly(3-substitutedthiophene) in which the 3-substitutent is an alkyl, aryl, or alkyl/aryl moiety with an oxygen substitution in the α-position of the 3-substituent as a HIL/HTL in an electroluminescent device.
2) The use of a regio-regular poly(3-substitutedthiophene) in which the 3-substitutent is an alkyl, aryl, or alkyl/aryl moiety with an oxygen substitution in the β-position of the 3-substituent as a HIL/HTL in an electroluminescent device.
3) The use of a regio-regular poly(3-substitutedthiophene) in which the 3-substitutent is an alkyl, aryl, or alkyl/aryl moiety with a hetero atom in the α-position of the 3-substituent as a HIL/HTL in an electroluminescent device.
4) Preferred Embodiment #3 in which the heteroatom is "S" or "O".
5) Embodiments #1-4 such that the regio-regular poly(3-substitutedthiophene) is a copolymer.
6) Embodiment #5 such that the copolymer is a block copolymer.
7) Embodiment #5 such that the copolymer is an alternating copolymer.
8) Embodiment #5 such that the copolymer is a random copolymer.
9) Embodiments #5-8 such that the copolymer comprises non-thiophene units.
10) Embodiment #9 such that the non-thiophene units are derived from $CH_2CH$ Ar, where Ar is any aryl or functionalized aryl group.
11) Embodiments #9 such that the non-thiophene units are derived from an isocyanate.
12) Embodiments #9 such that the non-thiophene units are derived from an ethylene oxides.
13) Embodiments #9 such that the non-thiophene units are derived from a conjugated diene.
14) Embodiments #9 such that the non-thiophene units are derived from a lactone.
15) Embodiments #9 such that the non-thiophene units are derived from a lactam.
16) Embodiments #9 such that the non-thiophene units are derived from a siloxane.
17) Embodiments #9 such that the non-thiophene units are derived from $CH_2CH_2R$ where R is Cl.
18) Embodiments #9 such that the non-thiophene units are derived from $CH_2CH_2R$ where R is OH.
19) Embodiments #9 such that the non-thiophene units are derived from $CH_2CH_2R$ where R is H.
20) Embodiments #9 such that the non-thiophene units are derived from $CH_2CH_2R$ where R is $CH_3$.
21) Embodiments #9 such that the non-thiophene units are derived from $CH_2CH_2R$ where R is an alkyl group.
22) Embodiments #9 such that the non-thiophene units are derived from $CH_2CH_2R$ where R is F.
23) Embodiments #9 such that the non-thiophene units are derived from $CH_2CH_2R$ where R is Br.
24) Embodiments #9 comprising non-regio-regular poly(3-substitutedthiophene) units derived from one or more thiophene units.
25) Embodiments #9 comprising non-regio-regular poly(3-substitutedthiophene) units derived from one or more functionalized oligothiophenes which is also random or well defined.
26) Embodiments #9 comprising non-regio-regular poly(3-substitutedthiophene) units derived from one or more functionalized oligothiophenes which is also well defined.
27) Embodiments #1-26 such that the HIL/HTL layer has been doped with an oxidant.
28) Embodiment #27 in which the doping agent is bromine.
29) Embodiment #27 in which the doping agent is iodine.
30) Embodiment #27 in which the doping agent is chlorine.
31) Embodiment #27 in which the doping agent is iron trichloride.
32) Embodiment #27 in which the doping agent is gold trichloride.
33) Embodiment #27 in which the doping agent is arsenic pentafluoride.
34) Embodiment #27 in which the doping agent is a protic acid.
35) Embodiment #27 in which the doping agent is a nitrosonium salt.
36) Embodiment #35 in which the nitrosonium salt is $NOPF_6$.
37) Embodiment #35 in which the nitrosonium salt is $NOBF_4$.
38) Embodiment #27 in which the doping agent is an organic oxidant.
39) Embodiments 1-38 in which the HIL/HTL has been blended with an EL material and applied as a transition layer between an unblended ELL and an unblended HIL/HTL or anode.
40) Embodiment #39 in which the EL material is either a small molecule or polymer electroluminescent material.

41) Embodiments #1-38 in which the HIL/HTL has been fully blended with an EL material and applied on an unblended HIL/HTL or anode.

42) Embodiment #41 in which the EL material is either a small molecule or polymer electroluminescent material.

43) Embodiments #1-38 in which the HIL/HTL has been blended with another HIL/HTL material and applied as a transition layer between an unblended ELL and an unblended HIL/HTL or anode.

44) Embodiment #43 in which the another HIL/HTL material is PEDOT, cuprous pthalocyanine (CuPc), NPD, NPB, PVK, TPD or other organic small molecule or polymer materials.

45) Embodiments #1-38 in which the HIL/HTL has been blended with a polymeric anode material and applied as a transition layer between an unblended polymeric anode and an unblended HIL/HTL or ELL.

46) Embodiment #45 in which the polymeric anode material is PEDOT, poly(3-substituted)thiophenes, polyaniline, polyphenylenevinylene, polyacetylene, or a combination thereof.

47) Embodiments #1-38 in which the HIL/HTL has been fully blended with a polymeric anode material and applied to conduct charge to an unblended HIL/HTL or ELL.

48) Embodiment #47 in which the polymeric anode material is PEDOT, poly(3-substituted)thiophenes, polyaniline, polyphenylenevinylene, polyacetylene, or a combination thereof.

49) Embodiments #1-48 in which the device is a bottom-emitting, active-matrix electroluminescent device.

50) Embodiments #1-48 in which the device is a passive-matrix electroluminescent device.

51) Embodiments #1-48 in which the device is a top-emitting, active-matrix electroluminescent device.

52) Embodiments #1-51 in which use is as a p-type material and the contamination of the p-type material with metallic impurities and other impurities does not exceed about 1,000 ppm, and more particularly, about 500 ppm, and more particularly, about 150 ppm.

53) Embodiments #1-52 in which regio-regular poly(3-substitutedthiophene) is used which comprises fluorine substituted alkyl and aryl functionality including perfluorinated alkyl and aryl groups.

54) Embodiments #1-53, wherein the HIL/HTL layer is neutral or undoped.

Additional Preferred Embodiments

Priority provisional application Ser. No. 60/612,640 comprises 65 claims which are incorporated herein by reference. In these claims, an embodiment, called herein "ABC," comprises an electroluminescent device comprising an HIL/HTL layer which comprises at least one polymer comprising a regio-regular poly(3-substitutedthiophene) in which the 3-substituent is an alkyl, aryl, or alkyl/aryl moiety with a heteroatom substitution in either the α- or beta-position of the 3-substituent. The substitution can be with oxygen or sulfur. Other more particular embodiments include the device according to ABC:

wherein the substitution is with oxygen.

wherein the substitution is with sulfur.

wherein the substitution is in the alpha position.

wherein the substitution is in the beta position.

wherein the substitution is oxygen in the alpha position.

wherein the substitution is oxygen in the beta position.

wherein the regioregular poly(3-substituted thiophene) is a homopolymer.

wherein the polymer is a homopolymer.

wherein the polymer is a copolymer.

wherein the polymer is a block copolymer.

wherein the polymer is an ABA block copolymer.

wherein the polymer is an AB block copolymer.

wherein the polymer is an alternating copolymer.

wherein the polymer is a random copolymer.

wherein the polymer is a copolymer comprising non-thiophene units.

wherein the polymer is a block copolymer comprising non-thiophene units.

wherein the polymer is mixed with at least one other polymer.

wherein the polymer is mixed with at least one other intrinsically conductive polymer.

wherein the polymer comprises non-thiophene units.

wherein non-thiophene units are present and the non-thiophene units comprise aryl or functionalized aryl groups.

wherein non-thiophene units are present and the non-thiophene units comprise urethane or urea linkages.

wherein non-thiophene units are present and the non-thiophene units comprise alkylene oxide units.

wherein non-thiophene units are present and the non-thiophene units comprise ethylenically unsaturated units.

wherein non-thiophene units are present and the non-thiophene units comprise units derived from a lactone or lactam.

wherein non-thiophene units are present and the non-thiophene units comprise siloxane units.

wherein non-thiophene units are present and the non-thiophene units are derived from $CH_2CH_2R$, wherein R is Cl, OH, H, $CH_3$, alkyl, F, or Br.

wherein non-thiophene units are present and the non-thiophene units are derived from an ATRP macroinitiator.

wherein the polymer is a copolymer which comprises at least two different thiophene units in the polymer chain.

wherein the polymer is a copolymer which comprises at least two different functionalized thiophene units in the polymer chain.

wherein the polymer comprises non-poly(3-substitutedthiophene) units derived from one or more thiophene units.

wherein the polymer comprises non-poly(3-substitutedthiophene) units derived from one or more functionalized thiophene units.

wherein the polymer comprises non-regio-regular poly(3-substitutedthiophene) units.

wherein the polymer comprises non-regio-regular poly(3-substitutedthiophene) units.

wherein the poly(3-substitutedthiophene) is further substituted at the 4 position.

wherein the HIL/HTL layer has been doped with a doping agent which is an oxidant.

wherein the HIL/HTL layer has been doped with a doping agent and the doping agent is bromine, iodine, or chlorine, or wherein the doping agent is iron trichloride.

wherein the doping agent is gold trichloride.

wherein the doping agent is arsenic pentafluoride.

wherein the doping agent is a protic acid.

wherein the doping agent is a nitrosonium salt.

wherein the nitrosonium salt is $NOPF_6$ or $NOBF_4$.

wherein the doping agent is an organic oxidant.

wherein the HIL/HTL layer comprises HIL/HTL material which has been blended with an EL material and applied as a transition layer between an unblended ELL and an unblended HIL/HTL or anode.

wherein the device comprises an EL material and the EL material is either a small molecule or polymer electroluminescent material.

wherein the device comprises an HIL/HTL material which has been fully blended with an EL material and applied in direct contact with an unblended HIL/HTL or anode.

wherein the EL is either a small molecule or polymer electroluminescent material.

wherein the device comprises HIL/HTL material which has been blended and applied as a transition layer between an unblended ELL and an unblended HIL/HTL or anode.

wherein the device comprises HIL/HTL material which is PEDOT, cuprous pthalocyanine (CuPc), NPD, NPB, PVK, TPD or other organic small molecule or polymer materials.

wherein the device comprises an HIL/HTL material which has been blended with a polymeric anode material and applied as a transition layer between an unblended polymeric anode and an unblended HIL/HTL or ELL.

wherein the polymeric anode is PEDOT, poly(3-substituted)thiophenes, poly(3-substituted)thienylene vinylenes, polyaniline, polyphenylenevinylene, poly(n-substituted)pyrroles, or polyacetylene.

wherein the device comprises HIL/HTL material which has been fully blended with a polymeric anode material and applied to conduct charge directly to an unblended HIL/HTL or ELL.

wherein the device is a bottom-emitting, active-matrix electroluminescent device.

wherein the device is a passive-matrix electroluminescent device.

wherein the device is a top-emitting, active-matrix electroluminescent.

wherein the contamination of the polymer with metallic impurities and other impurities does not exceed about 1,000 ppm.

wherein the contamination of the polymer with metallic impurities and other impurities does not exceed about 500 ppm.

Another embodiment is the use of a regio-regular poly(3-substitutedthiophene) in which the 3-substituent is an alkyl, aryl, or alkyl/aryl moiety with an oxygen or sulfur substitution in α-position of the 3-substituent as a HIL/HTL in an electroluminescent device.

Another embodiment is the use of a regio-regular poly(3-substitutedthiophene) in which the 3-substituent is an alkyl, aryl, or alkyl/aryl moiety with an oxygen or sulfur substitution in the β-position of the 3-substituent as a HIL/HTL in an electroluminescent device.

Another embodiment is the use of a regio-regular poly(3-substitutedthiophene) in which the 3-substituent is an alkyl, aryl, or alkyl/aryl moiety with a hetero atom in either the α- or beta position of the 3-substituent as a HIL/HTL in an electroluminescent device.

Another embodiment is an electroluminescent device comprising an ELL material and an HIL/HTL material, wherein the HIL/HTL material comprises at least one polymer comprising a regio-regular poly(3-substitutedthiophene) in which the 3-substituent is an alkyl, aryl, or alkyl/aryl moiety with a heteroatom substitution in either the α- or beta-position of the 3-substituent, wherein the HIL/HTL material bonds with the ELL layer. The bonding can be a covalent bonding. The HIL/HTL layer can be neutral or undoped.

Stability

An advantage provided herein includes improved stability including improved thermal stability. Stability can be measured by, for example, changes in a property of the polymer such as conductivity or spectral absorption in film form. Spectral absorption can be measured at one, two, or more spectral wavelengths. High stress, short term stability experiments can provide insight into lower stress, longer term stability behavior through kinetic modeling. One useful test comprises heating a sample at 110° C. for 10 minutes. Changes in the physical property can be, for example 30% or less, or 20% or less, or 10% or less. Compared to a benchmark, the stability can be improved by at least 10%, or at least 20%, or at least 30%.

WORKING EXAMPLES

Also provided are the following non-limiting working examples:

Example 1

Doping of poly(3-(1,4,7-trioxaoctyl))thiophene) (ICP) with 2,3-Dichloro-5,6-Dicyano-1,4-Benzoquinone.

Figure 13:
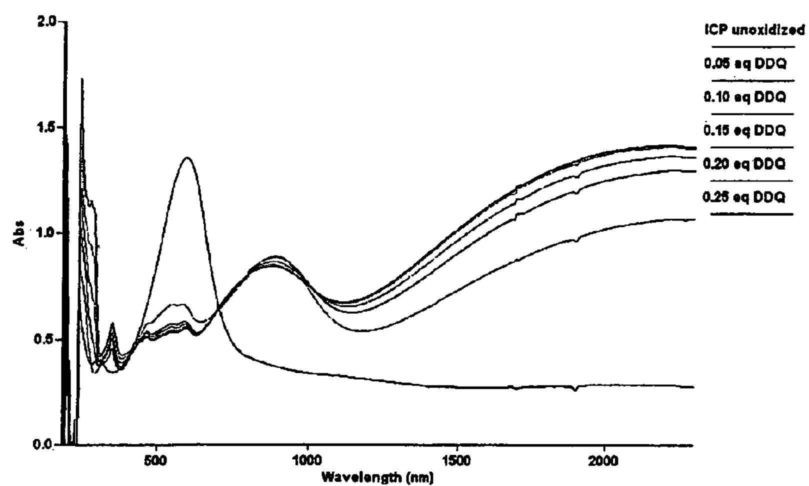
FIG. 13 provides UV-VIS-NIR spectral data for doping of ICP with DDQ (Example 1).

ICP was weighed out into a 50 ml volumetric flask and chloroform was pipetted into the flask until full. This solution was made such that the absorbance =1 at λmax. 2,3-dichloro-5,6-dicyano-1,4-benzoquinone (DDQ) was weighed out into a vial and 5 ml chloroform was pipetted via a 1 ml micropipette into the vial. DDQ/$CHCl_3$ solution was pipetted in 20 μl aliquots (0.05 eq relative to repeat unit of ICP) into 3 ml ICP/$CHCl_3$ solution in a quartz (1 cm) cuvette. A UV-Vis-NIR spectrum (250-2300 nm) was obtained after each addition of dopant solution. Data were collected until 0.5 mole equivalents of dopant per repeat unit was reached. UV spectral data are provided in FIG. 13.

Data acquisition was performed on a Cary model 5000 UV-Vis-NIR spectrometer with a scan range of 180 to 2300 nm with a scan rate of 2000 nm/min operated in double-beam mode. A baseline correction scan was obtained for each run or change of solvent system.

Example 2

Doping of poly(3-(1,4,7-trioxaoctyl))thiophene) (ICP) with Dinonylnaphthalene-Disulfonic Acid (DNNDSA).

Figure 14:
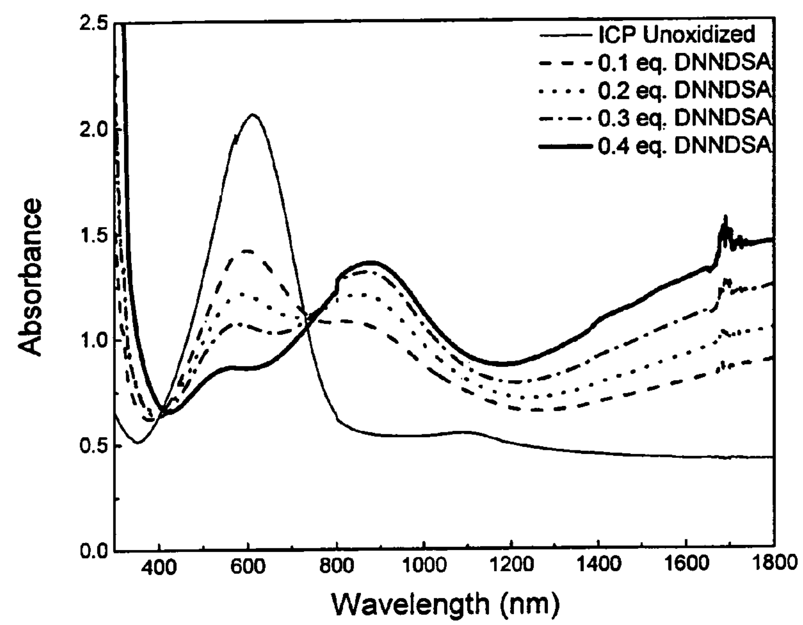
FIG. 14 provides UV-VIS-NIR spectral data for doping ICP with DNNDSA (Example 2).

ICP was weighed out into a 50 ml volumetric flask and chloroform was pipetted into the flask until full. This solution was made such that the absorbance =1 at λmax. DNNDSA was weighed out into a vial and 5 ml chloroform was pipetted via a 1 ml micropipette into the vial. DNNDSA/$CHCl_3$ solution was pipetted in 20 μl aliquots (0.5 eq relative to repeat unit of ICP) into 3 ml ICP/$CHCl_3$ solution in a quartz (1 cm) cuvette. A UV-Vis-NIR spectrum (250-2300 nm) was obtained after each addition of dopant solution. Data were collected until 50 mole equivalents of dopant per repeat unit was reached. UV spectral data are provided in FIG. 14.

Example 3

Figure 15:
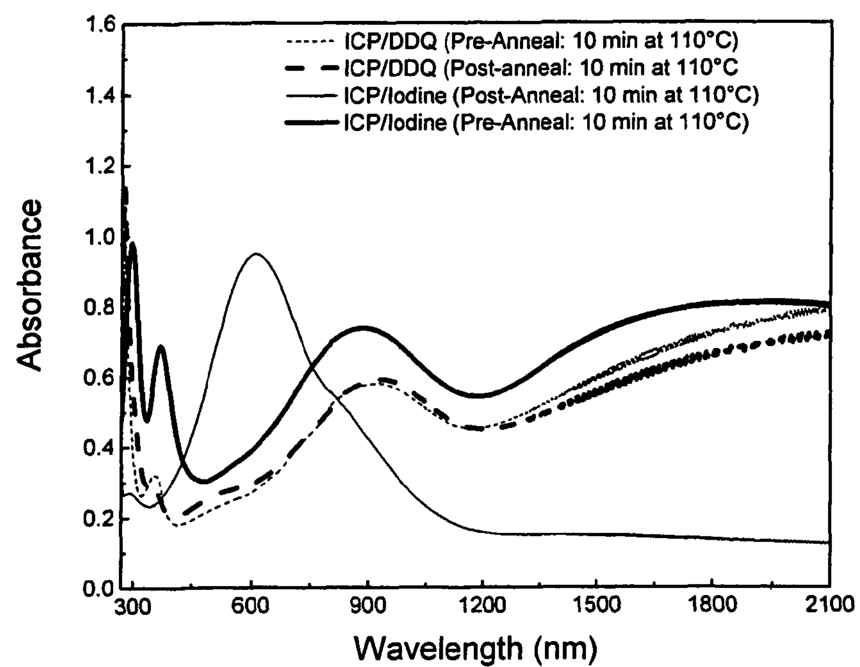
FIG. 15 provides UV-VIS-NIR spectral data for illustration of improved thermal stability of ICP doped with DDQ versus inorganic oxidation by iodine (Example 3).

Increased Thermal Stability of poly(3-(1,4,7-trioxaoctyl))thiophene) (ICP) Doped with DDQ as Compared to Iodine Doping of Same ICP A film of ICP doped with DDQ (0.25 eq) was cast from a chloroform solution (3.0 mg/mL) and allowed to dry under a saturated atmosphere of the solvent. A spectrum was taken right after casting. The dried film was placed on a hot plate at 110° C. for 10 minutes under a nitrogen atmosphere blanket and a spectra was obtained. The iodine control was based on an iodine vapor exposed neutral film which was cast from a 3.0 mg/mL solution of chloroform.
This iodine film was exposed to the same annealing conditions as described for the DDQ doped sample. UV spectral data are provided in FIG. 15. The thermal stability was better compared to a similar polythiophene with hexyl side group and no heteroatomic substitution.

What is claimed is:

1. An electroluminescent device comprising a hole injection layer which comprises at least one regio-regular poly(3-substitutedthiophene) which is soluble in organic solvent, wherein the regio-regular poly(3-substituted thiophene) has a degree of regioregularity of about 90% or more, and wherein the 3-substituent is an alkyl moiety with an oxygen substitution in the α-position of the 3-substituent, and wherein the 3-substituent has multiple oxygen substitutions.

2. The device according to claim 1, wherein the polymer is a homopolymer.

3. The device according to claim 1, wherein the polymer is a copolymer.

4. The device according to claim 1, wherein the polymer is a copolymer which comprises at least two different thiophene units in the polymer chain.

5. The device according to claim 1, wherein the hole injection layer further comprises at least one dopant for the regioregular poly(3-substitutedthiophene).

6. The device of claim 1, wherein the 3-substituent is a 1,4,7-trioxaoctyl substituent.

7. The device of claim 1, wherein the regio-regular poly(3-substitutedthiophene) has a degree of regioregularity of about 95% or more.

8. The device of claim 1, wherein the regio-regular poly(3-substitutedthiophene) has a degree of regioregularity of about 98% or more.

9. The device of claim 1, wherein the regio-regular poly(3-sustitutedthiophene) is manufactured in the neutral state and then doped.

10. The device of claim 1, wherein the device comprises a phosphorescent emitter layer.

11. An electroluminescent device comprising a hole injection layer which comprises at least one regio-regular poly(3-substitutedthiophene) which is soluble in organic solvent, wherein the regio-regular poly(3-substituted thiophene) has a degree of regioregularity of about 90% or more, and wherein the 3-substituent is an alkyl moiety with an oxygen substitution in the α-position of the 3-substituent, and wherein the 3-substituent has multiple oxygen substitutions, and wherein the hole injection layer does not comprise poly(3,4-ethylenedioxythiophene).

* * * * *